(12) United States Patent
Ke

(10) Patent No.: US 6,323,742 B1
(45) Date of Patent: Nov. 27, 2001

(54) RF SMART COMBINER/SPLITTER

(75) Inventor: Meng-Kun Ke, Parsippany, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/419,450

(22) Filed: Oct. 15, 1999

(51) Int. Cl.[7] .............................. H01P 1/10; H01P 5/12; H01P 3/08
(52) U.S. Cl. ...................... 333/127; 333/101; 333/104
(58) Field of Search .................................. 333/101, 103, 333/104, 105, 125, 127, 128, 136

(56) References Cited

U.S. PATENT DOCUMENTS 5,754,082 * 5/1998 Swanson .............................. 333/124

* cited by examiner

Primary Examiner—Robert Pascal
Assistant Examiner—Kimberly E Glenn
(74) Attorney, Agent, or Firm—Fay, Sharpe, Fagan, Minnich & McKee, LLP

(57) ABSTRACT

An impedance transforming device includes a first port capable of receiving first signals. A first switching device is electrically connected to the first port. The first switching device is electrically and dynamically connected to an input of one of at least two impedance transforming devices. A second switching device is electrically and dynamically connected to an output of the impedance transforming device. A second port, electrically connected to the second switching device, is capable of outputting second signals. The impedance transforming device is determined at least as a function of respective impedance transformations of the impedance transforming devices.

16 Claims, 5 Drawing Sheets

RF SMART COMBINER/SPLITTER

BACKGROUND OF THE INVENTION

The present invention relates to power combiners and splitters. It finds particular application in conjunction with impedance transforming power combiners and splitters, and will be described with particular reference thereto. It will be appreciated, however, that the invention is also amenable to other like applications.

Impedance transformation networks are utilized in radio frequency ("RF") circuitry to step up or step down the impedance level between pairs of ports for input and output circuits having different source and load impedances, respectively. The impedance transformation network is typically arranged so that the load impedance provided to the input circuit by the impedance transformation network matches as nearly as possible the source impedance of the input circuit. Similarly, the network is arranged so that the source impedance provided to the output circuit by the impedance transformation network matches as nearly as possible the load impedance of the output circuit. Impedance matching is desirable since under these conditions there is a maximum power transfer and a minimum of signal distortion and/or reflection between the input and output circuits.

Power dividers and combiners are useful in a wide variety of circuits. Specific applications include combining multiple power amplifier stages in order to achieve a desired high power output. Since most solid state power devices, such as MESFETs, PHEMTs, and bipolar transistors have low input and output impedances, successive impedance transformations are often necessary to achieve 50 ohm input and output impedance levels.

There are several technologies currently available that provide power combining/splitting, including radial combiners, split lines and branch line combiners.

For example, a power combiner/splitter known as the Wilkinson power combiner/splitter offers binary combining/splitting (i.e., successive multiplications or divisions by two (2)). However, the Wilkinson power combiner/splitter is limited in that the multiplications/divisions are always by a factor of two (2). Furthermore, the input and output impedances are all equal to a characteristic impedance $Z_0$. The Wilkinson design does not facilitate the use of different input and output impedances regardless of whether it is used as a combiner or a splitter. Since the Wilkinson power combiner/splitter uses quarter-wavelength lines in each multiplication/division and is binary, each multiplication/division past the first requires space for the additional quarter-wavelength lines. Moreover, the Wilkinson power combiner/splitter does not offer N-way combining.

While conventional power combining/splitting methods and apparatuses are suitable for many applications, they do not provide for selective power combining/splitting any number (e.g., N-way) of RF input signals into a single RF output.

The present invention provides a new and improved apparatus and method which overcomes the above-referenced problems and others.

SUMMARY OF THE INVENTION

A signal combiner includes a plurality of inputs receiving respective input signals. Each of the inputs has a respective input impedance. A first transforming device, having a first transforming impedance, receives a first transforming device input signal formed from at least one of the input signals. An equivalent impedance is determined as a function of a number of the inputs forming the first transforming device input signal. An output, having an output impedance, is electrically connected to the first transforming device. An output signal, which is formed as a function of the first transforming device input signal, is produced by the output. The first transforming device matches the equivalent impedance to the output impedance within an acceptable tolerance.

In accordance with one aspect of the invention, a second transforming device has a second transforming impedance. A first switch is electrically connected to at least one of the inputs. The first switch also is electrically and selectively connected to a chosen one of the transforming devices, which is determined at least as a function of the equivalent impedance and the respective impedances of the transforming devices. The output is electrically connected to the chosen transforming device.

In accordance with another aspect of the invention, a second transforming device has a second transforming impedance. Each of the transforming devices includes a plurality of transformers having respective impedances. One of the transformers in each of the transforming devices provides the respective transforming impedance. A first switch is electrically connected to one of the inputs. The first switch also is electrically and selectively connected to a first chosen one of the transformers within the first transforming device, which is determined at least as a function of the impedance of the first input and the respective impedances of the transformers within the first transforming device. A second switch is electrically connected to another one of the inputs. The second switch also is electrically and selectively connected to a second chosen one of the transformers within the second transforming device, which is determined at least as a function of the impedance of the second input and the respective impedances of the transformers within the second transforming device. The output is electrically connected to the first and second chosen transformers.

In accordance with another aspect of the invention, the plurality of inputs include four inputs. At least three of the inputs provides the respective input signals, and not a high impedance, to the first transforming device. The first transforming impedance transforms the equivalent impedance to within the tolerance of the output impedance when either one of three and four of the inputs provide the respective input signals, and not a high impedance, to the first transforming device.

One advantage of the present invention is that it provides for selectively combining any number (e.g., N-way) of RF input signals into a single RF power output.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
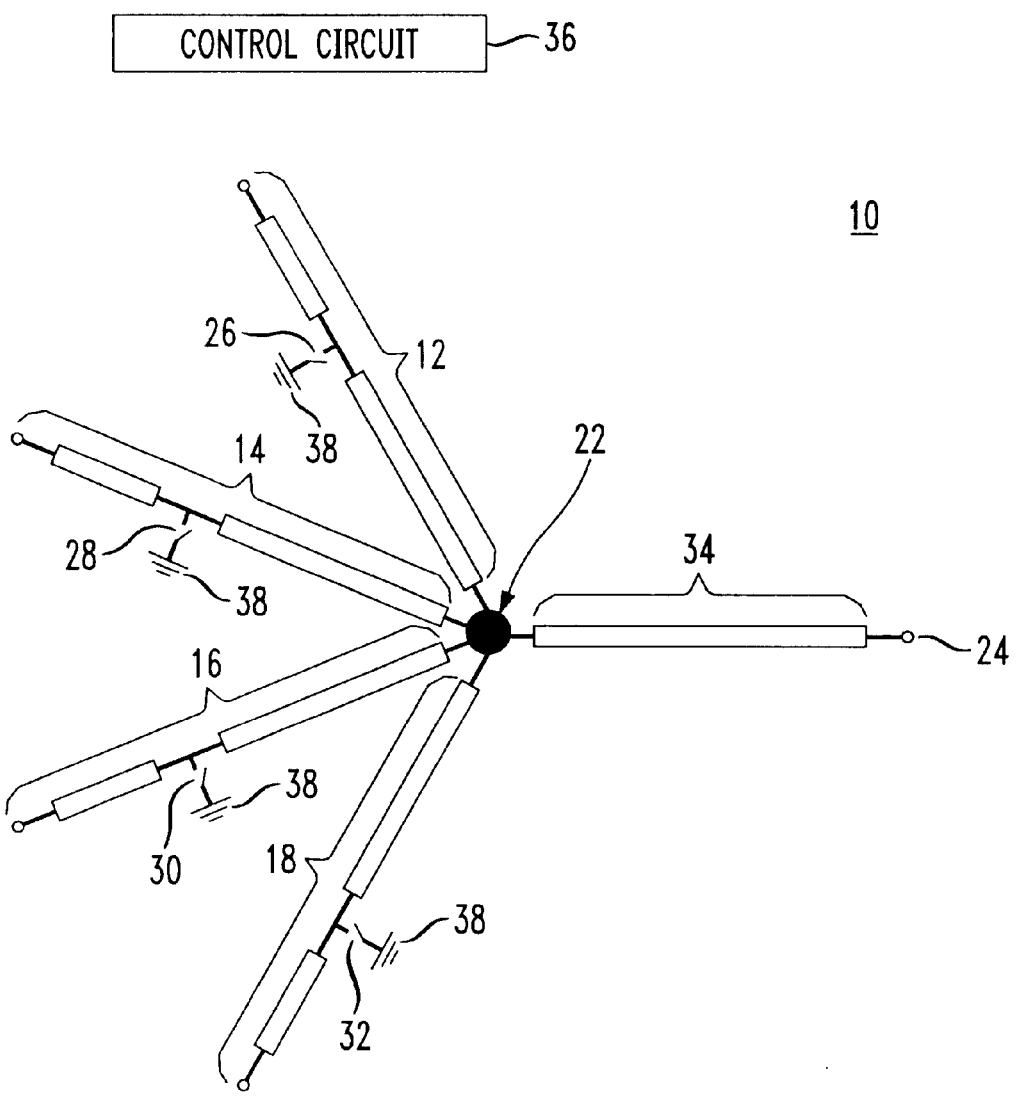
FIG. 1 illustrates a combining device according to the present invention.

FIG. 1 illustrates a combining device 10 having four (4) respective inputs 12, 14, 16, 18, an electrical connection point 22, and an output 24. The inputs 12, 14, 16, 18 are electrically connected to the electrical connection point 22, which, in turn, is electrically connected to the output 24. Four (4) grounding switches 26, 28, 30, 32 are electrically connected to the respective inputs 12, 14, 16, 18 about one-quarter wavelength from the electrical connection point 22. The inputs 12, 14, 16, 18 receive input signals, which, when the respective grounding switches 26, 28, 30, 32 are open, are passed to the electrical connection point 22. Preferably, the input signals are radio frequency ("RF") signals. However, microwave frequency or higher input signals are also contemplated. The input signals are combined at the electrical connection point 22 to form a transformer input signal. The transformer input signal is transmitted from the electrical connection point 22 to a transformer 34.

A control circuit 36 determines the number of input signals received at the respective inputs 12, 14, 16, 18. The control circuit 36 sets the respective grounding switches 26, 28, 30, 32 to the opened/closed position as a function of the signals received at the respective inputs 12, 14, 16, 18. When the grounding switches 26, 28, 30, 32 are closed to an electrical ground 38, a very high impedance (e.g., >> the input and output impedance) is seen from the connection point 22 toward the respective input 12, 14, 16, 18. Consequently, input signals are only received at the connection point 22 from the inputs 12, 14, 16, 18 for which the respective grounding switch 26, 28, 30, 32 is open.

It is desirable to combine and transform the input signals into the output signal in an efficient manner (i.e., so that the output signal has substantially the same power as the input signal). To achieve this result, the impedance of the output 24 substantially matches the impedances of the inputs 12, 14, 16, 18. In the example shown in FIG. 1, the four (4) inputs 12, 14, 16, 18 are electrically parallel to one another. In general, if each of n grounding switches for each of n respective inputs is open, and each of the n inputs has an impedance of $Z_0$ over a quarter-wavelength, an equivalent input impedance is $Z_0/n$. Therefore, if each of the four (4) grounding switches 26, 28, 30, 32 in the combining device 10 of FIG. 1 is open, the equivalent input impedance is $Z_0/4$. Alternatively, if three (3) of the four (4) grounding switches 26, 28, 30, 32 in the combining device 10 of FIG. 1 are open, the equivalent input impedance is $Z_0/3$.

In the preferred embodiment, at most two (2) of the switches 26, 28, 30, 32 are connected to the ground at any time. Therefore, the connection point 22 receives input signals from either three (3) or four (4) of the inputs 12, 14, 16, 18. The inputs 12, 14, 16, 18 providing input signals to the connection point 22 are considered to be "active." Ideally, the impedance of the output 24 exactly matches an equivalent impedance of the active inputs. In this case, the power of the input signals is transferred through the transformer 34 in a most efficient manner. The efficiency of the power transferred through the transformer 34 decreases as a function of an amount by which the impedance of the output of the transformer 34 varies from an impedance of the output 24. Therefore, if the impedance of the output 24 is slightly mismatched from the equivalent impedance of the inputs 12, 14, 16, 18, the amount of the power transferred through the transformer 34 is reduced accordingly.

In the preferred embodiment, in which at most two (2) of the switches 26, 28, 30, 32 are connected to the ground at any time, the power of the input signals is substantially transferred through the transformer 34 if the output impedance of the transformer 34 substantially matches the impedance of the output 24 (i.e., if the output impedance of the transformer 34 is within an acceptable tolerance of the impedance of the output 24). More specifically, the power of the signals is substantially transferred if the transformer 34 includes a transmission line impedance between $Z_0/4$ and $Z_0/3$ (e.g., $Z_0/3.5$). Because the impedance of the output 24 is not exactly optimized for either three (3) or four (4) active inputs, some loss does occur. However, the resulting impedance is within the acceptable tolerance. If the transmission line impedance of the transformer 34 is $Z_0/3.5$, for example, the power of the input signals is substantially transferred through the transformer 34 (i.e., the resulting impedance is within the acceptable tolerance).

Although the grounding switches are connected about one-quarter wavelength away from the connection point in the preferred embodiment, it is also contemplated that the switches be positioned "in-line" with the inputs. In that embodiment, it is possible to connect the switches substantially at the connection point (i.e., rather than one-quarter wavelength away from the connection point). Furthermore, rather than connecting the inputs to ground, the switches are closed/opened for connecting/disconnecting the inputs to the connection point.

Figure 2:
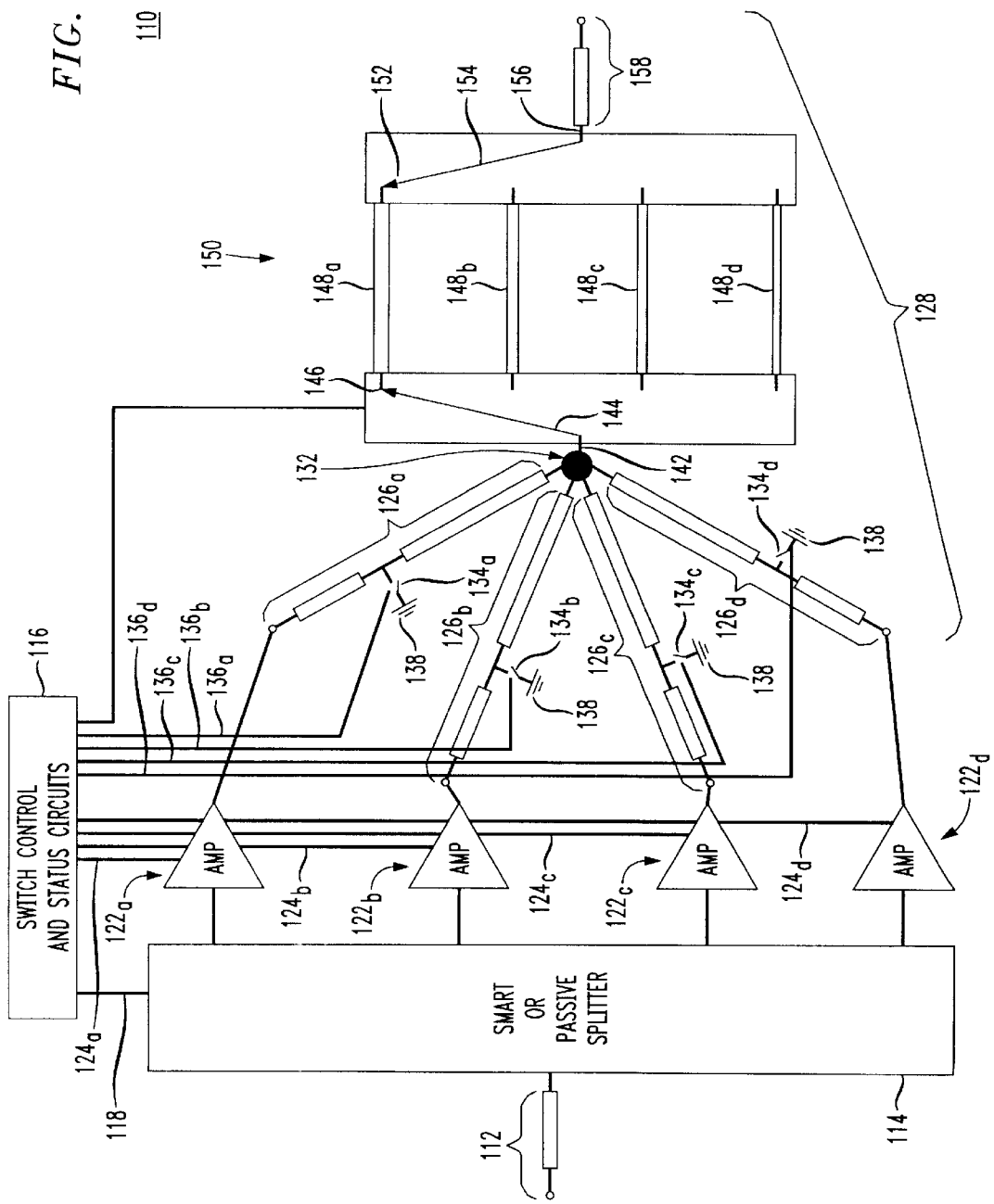
FIG. 2 illustrates a combining system according to the present invention.
Figure 3:
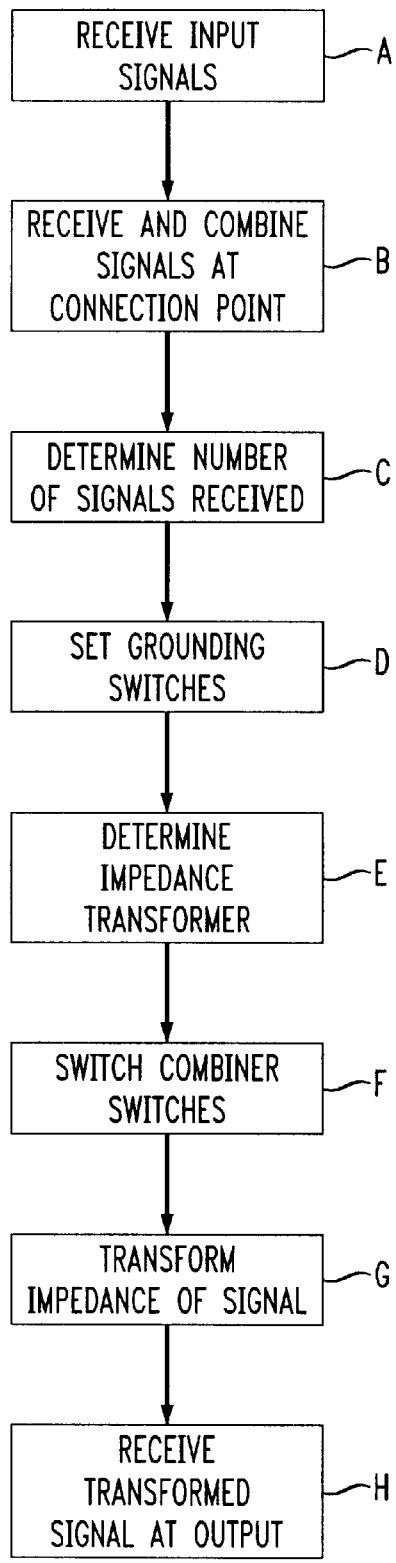
FIG. 3 illustrates a flowchart showing the steps for combining the signals according to the combining system shown in FIG. 2 of the present invention.

With reference to FIGS. 2 and 3, a system 110 for combining signals includes a system input port 112, which receives a system input signal. Although the system input signal is preferably a radio frequency signal, microwave frequency or higher input signals are also contemplated. The system input signal is transmitted from the input port 112 to a smart/passive splitter 114, where it is divided into four (4) splitter output signals. A control circuit 116 determines the manner in which the system input signal is transformed into the four (4) splitter output signals. Control signals are communicated to the smart/passive splitter 114 via a control line 118.

Four (4) amplifiers 122 receive the four (4) respective splitter output signals. The amplifiers 122, which are electrically connected to the control circuit 116 via respective control lines 124, increase the powers of the respective signals by amounts determined by the control circuit 116. It is to be understood that the control circuit 116 includes controls that permit a user to selectively set the respective powers of the amplifiers 122.

Each of the amplifiers 122 transmits an amplified output signal to one (1) of four (4) respective inputs 126 of a programmable combiner 128 in a step A. It is to be understood that the impedances of the amplified output signals are substantially matched to the respective impedances of the inputs 126. Therefore, the respective powers of the amplified output signals are transmitted to the inputs 126 in an efficient manner. Each of the inputs 126 electrically communicates with an electrical connection point 132. The amplified output signals are received and combined at the connection point 132 in a step B.

Four (4) respective grounding switches 134 are included along the programmable combiner inputs 126. Each of the grounding switches 134 is preferably a single-pole, double-throw switch and is located about one-quarter wavelength away from the connection point 132. The grounding switches 126 are controlled by the control circuit 116 via respective control lines 136.

If a grounding switch 134 is open, the respective amplified output signal is transmitted to the connection point 132 along the respective combiner input 126. Alternatively, if a grounding switch 134 is closed, the respective combiner input 126 is electrically connected to an electrical ground 138. In that case, the connection point 132 sees a very high impedance towards the respective combiner input 126. Consequently, the number of amplified output signals combined at the connection point 132 is a function of the number of grounding switches 134 that are opened or closed by the control circuit 116.

The control circuit 116 determines the number of amplified output signals received from the amplifiers 122 in a step C. The control circuit 116 sets the respective grounding switches 134 to the opened/closed position in a step D.

The electrical connection point 132 is electrically connected to a first connector 142 of a first combiner switch 144. A second connector 146 of the first combiner switch 144 is electrically connected to one (1) of four (4) impedance transformers 148 within a transforming device 150. A first connector 152 of a second combiner switch 154 is connected to the same impedance transformer 148. A second connector 156 of the second combiner switch 154 is electrically connected to an output port 158.

The control circuit 116 determines, in step E, which impedance transformer 148 to which the first and second combiner switches 144, 154 connect. The first and second combiner switches 144, 154 are selectively and dynamically switched to the impedance transformer 148 as a function of the number of grounding switches 134 set to the opened or closed position.

More specifically, in the preferred embodiment, an impedance of $Z_0$ exists along the quarter wavelength of each combiner input 126, between the connection point 132 and the respective grounding switch 134, and along a quarter wavelength of the output port 158. Because each of the combiner inputs 126 is connected to the connection point 132 in parallel, an equivalent input impedance, from the connection point 132 towards the grounding switches 134, is calculated as:

$$Z_{equivalent} = Z_0/n,$$

where n represents the number of the grounding switches 134 in the open position. Therefore, if, for example, $Z_0$=50 ohms and the first three (3) grounding switches $134_a$, $134_b$, $134_c$ are set to the open position and the fourth grounding switch $134_d$ is set to the closed position (i.e., connected to the ground):

$$Z_{equivalent}\ 50/3 = 16\tfrac{2}{3}\ ohms.$$

Each of the impedance transformers 148 includes, over a quarter-wavelength, an impedance of:

$$Z_0/\sqrt{n},$$

where n represents the number of the grounding switches 134 in the open position.

The first impedance transformer $148_a$, which is connected to the combiner switches 144, 154 if three (3) of the grounding switches 134 are closed to the ground 138 and one (1) of the grounding switches 134 receives an amplified output signal, includes a transforming impedance $Z_0/\sqrt{1}$ (i.e., $Z_0$) over a quarter wavelength.

The second impedance transformer $148_b$, which is connected to the combiner switches 144, 154 if two (2) of the grounding switches 134 are closed to the ground 138 and two (2) of the grounding switches 134 receive respective amplified output signals, includes a transforming impedance $Z_0/\sqrt{2}$ (i.e., $Z_0/1.4$) over a quarter wavelength.

The third impedance transformer $148_c$, which is connected to the combiner switches 144, 154 if one (1) of the grounding switches 134 is closed to the ground 138 and three (3) of the grounding switches 134 receive respective amplified output signals, includes a transforming impedance $Z_0/\sqrt{3}$ (i.e., $Z_0/1.7$) over a quarter wavelength.

The fourth impedance transformer $148_d$, which is connected to the combiner switches 144, 154 if zero (0) of the grounding switches 134 is closed to the ground 138 and all four (4) of the grounding switches 134 receive respective amplified output signals, includes a transforming impedance $Z_0/\sqrt{4}$ (i.e., $Z_0/2.0$) over a quarter wavelength.

In the example described above, one (1) of the grounding switches $134_d$ is connected to the ground 138 and three (3) of the grounding switches $134_a$, $134_b$, $134_c$ are open (i.e., so that the connection point 132 receives signals from three (3) of the amplifiers $122_a$, $122_b$, $122_c$). Therefore, the control circuit 116 switches the combiner switches 144, 154 to the third impedance transformer $148_c$ in a step F. The impedance of the third transformer $148_c$ transforms the impedance of the three (3) amplified outputs (i.e., 50 ohms/3=16⅔ ohms) into a combiner output signal having an impedance of 50 ohms in a step G. Because the combiner output has an impedance of 50 ohms, the power of the combined amplified outputs is efficiently transferred to the combiner output 158 in a step H.

Although FIG. 2 has been described in terms of a system 110 for combining signals, it is to be understood that the system 110 could function equally well for splitting signals. If the system 110 acts as a splitter, the output 158 acts as the an input while the inputs 126 act as respective outputs. It is to be understood that the grounding switches 134 may be electrically connected to the input.

Figure 4:
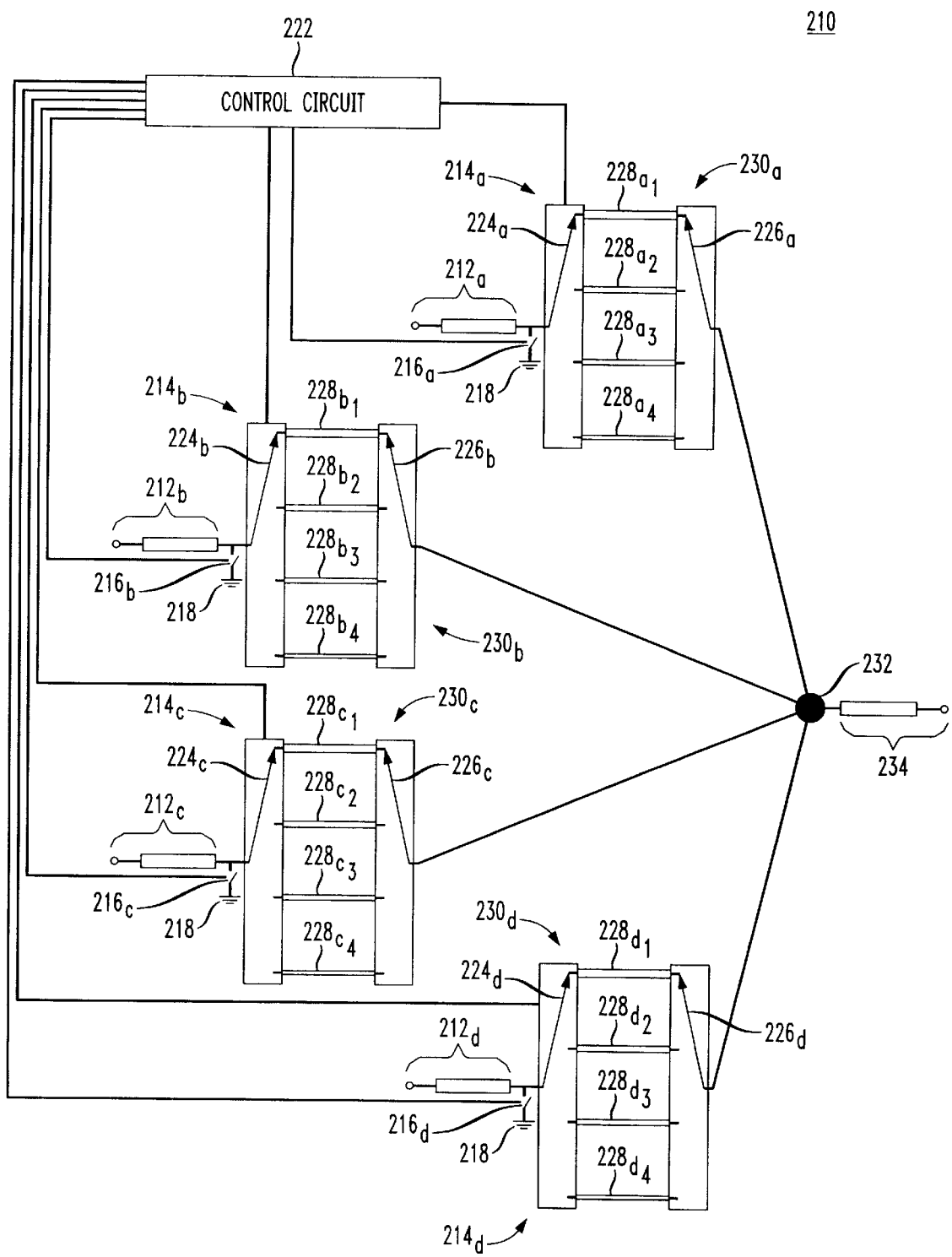
FIG. 4 illustrates a combining system according to an alternate embodiment of the present invention.
Figure 5:
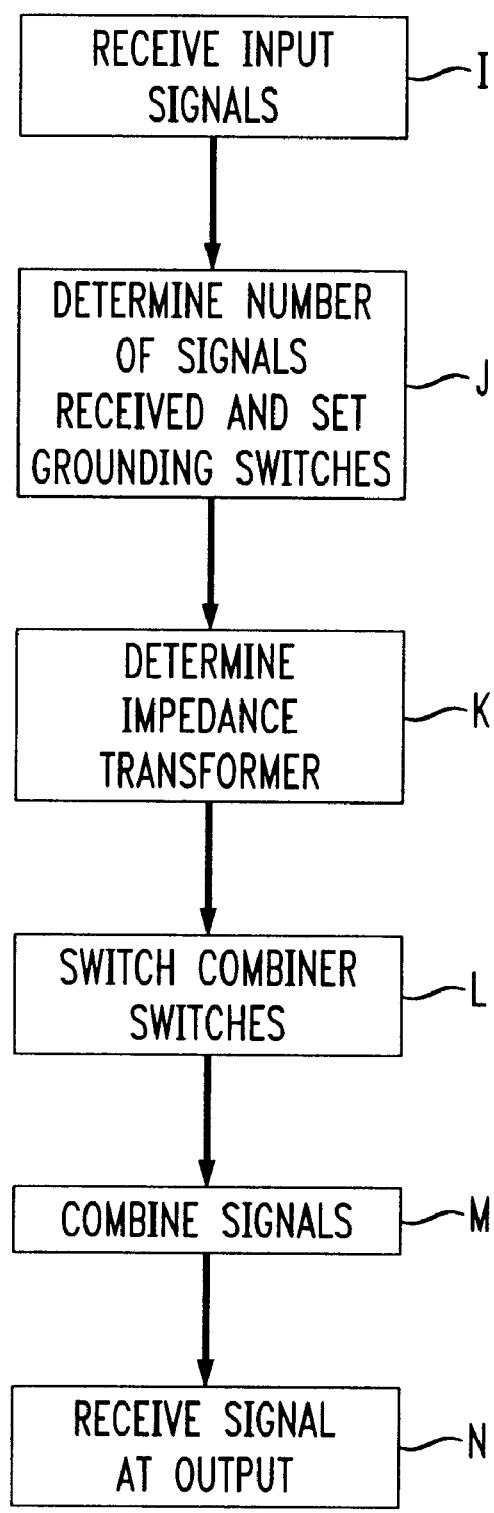
FIG. 5 illustrates a flowchart showing the steps for combining the signals according to the combining system shown in FIG. 4 of the present invention.

FIGS. 4 and 5 illustrate a combining device 210 and flowchart according to an alternate embodiment of the present invention. With reference to FIGS. 4 and 5, amplified output signals are received at inputs 212 of four (4) respective combiners 214 in a step I. Each of the combiner inputs 212 includes a respective grounding switch 216, which, in a step J, is switched to a ground 218 if no amplified output signal is present at the respective input 212. As in the previous embodiment, a control circuit 222 controls the operation of the combining device 210.

Each of the combiners 214 includes first and second combiner switches 224, 226, respectively. Each of the first switches 224 is electrically connected to the respective combiner input 212 and one (1) of four (4) impedance transformers 228 within respective transforming devices 230. Each of the second switches 226 is electrically connected to the same impedance transformer 228 to which the first switch 224 is connected and is also electrically connected to an electrical connection point 232.

The control circuit determines, in a step K the impedance transformer 228 to which the switches 224, 226 are to be set. More specifically, if three (3) of the grounding switches 216a, 216b, 216c are open, and one of the switches 216d is closed, each of the respective combiner switches 224, 226 connects to the impedance transformer $228_3$.

The control circuit 222 sets the combiner switches 224, 226 to one (1) of the impedance transformers 228, in a step L, as a function of the number of input signals received. Signals output from the respective combiners 214 are combined at the connection point 232 in a step M and transmitted to an output port 234 in a step N.

Each of the first impedance transformers $228_1$ in the respective combiners 214 includes a transforming impedance of $\sqrt{1} \times Z_0$ (i.e., $Z_0$) over a quarter-wavelength. Each of the second impedance transformers $228_2$ in the respective combiners 214 includes a transforming impedance of $\sqrt{2} \times Z_0$ (i.e., $1.4 \times Z_0$) over a quarter-wavelength. Each of the third impedance transformers $228_3$ in the respective combiners 214 includes a transforming impedance of $\sqrt{3} \times Z_0$ (i.e., $1.7 \times Z_0$) over a quarter-wavelength. Each of the fourth impedance transformers $228_4$ in the respective combiners 214 includes a transforming impedance of $\sqrt{4} \times Z_0$ (i.e., $2.0 \times Z_0$) over a quarter-wavelength.

The control circuit 222 manages the operations of the grounding switches 216 and switches 224, 226 within the combiners 214. If each of three (3) respective signals input to the respective combiner inputs $212_a$, $212_b$, $212_c$ has an impedance of 50 ohms, the control circuit 222 sets the three (3) grounding switches $216_a$, $216_b$, $216_c$, to the open position and the fourth grounding switch $216_d$ to the closed position. Then, at least each of the combiner switches $224_a$, $224_b$, $224_c$, $226_a$, $226_b$, $226_c$ is set to the third impedance transformer $228_3$. Consequently, the respective impedances of the three (3) amplified output signals, which are received at the inputs $212_a$, $212_b$, $212_c$, are transformed in the respective third impedance transformers $228_3$. The transformed signals are transmitted to the connection point 232, where the signals are combined to have an impedance of 50 ohms, which matches the impedance of the output port 234. Therefore, the respective powers of the amplified signals are efficiently transferred to output port 234.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A signal combiner, comprising:
   a plurality of inputs receiving respective input signals, each of the inputs having a respective input impedance;
   first and second transforming devices having respective first and second transforming impedances, one of the transforming devices receiving a transforming device input signal formed from at least one of the input signals, an equivalent impedance being determined as a function of a number of the inputs forming the transforming device input signal;
   an output, having an output impedance, electrically connected to the one of the transforming devices, an output signal, which is formed as a function of the transforming device input signal, being produced by the output, the one of the transforming devices matching the equivalent impedance to the output impedance within a tolerance; and
   a first switch electrically connected to at least one of the inputs, the first switch also being electrically and selectively connected to the one of the transforming devices.

2. The signal combiner as set forth in claim 1, wherein the respective impedances of the inputs are determined at least as a function of a number of the inputs connected to an electrical ground.

3. The signal combiner as set forth in claim 2, further including:
   a third transforming device having a third transforming impedance; and
   a fourth transforming device having a fourth transforming impedance, the one of the transforming devices being determined at least as a function of the equivalent impedance and the respective transforming impedances of the four transforming devices;
   wherein the plurality of inputs include four inputs receiving four respective input signals;
   wherein $Z_0$ represents respective impedances for each of the four inputs and the output over about one-quarter wavelength;
   wherein the first, second, third, and fourth transforming devices have transforming impedances of about $Z_0$, $Z_0/1.4$, $Z_0/1.7$, and $Z_0/2.0$, respectively, over about one-quarter wavelength; and
   wherein one of the first, second, third, and fourth transforming devices, respectively, is the one of the transforming devices when three, two, one, and zero of the inputs, respectively, are connected to the ground.

4. The signal combiner as set forth in claim 2, further including:
   a plurality of ground switches for selectively switching the respective inputs between a signal source and the ground; and
   a control circuit for selectively controlling the first switch and the ground switches.

5. The signal combiner as set forth in claim 4, wherein the signal source includes respective amplifiers electrically connected to the inputs.

6. The signal combiner as set forth in claim 1, further including:
   an electrical connection point electrically connected to the inputs and to the first switch.

7. A signal combiner, comprising:
   a plurality of inputs receiving respective input signals, each of the inputs having a respective input impedance;
   first and second transforming devices each including a plurality of transformers having respective impedances, one of the transformers in each of the transforming devices receiving a respective transforming device input signal formed from at least one of the input signals, respective equivalent impedances being determined as a function of a number of the inputs forming the transforming device input signals;
   an output, having an output impedance, electrically connected to the respective ones of the transformers in each of the transforming devices, an output signal, which is formed as a function of the transforming device input signals, being produced by the output;
   a first switch electrically connected to one of the inputs, the first switch also being electrically and selectively connected to the transformer within the first transforming device having an impedance matching the output impedance within an tolerance; and
   a second switch electrically connected to another one of the inputs, the second switch also being electrically and selectively connected to the transformer within the second transforming device having an impedance matching the output impedance within an tolerance.

8. A method of matching impedances of radio frequency signals, including:
   receiving a first signal at a first input an input signal including the first signal;

determining a chosen impedance transformer at least as a function of an impedance of the first input and respective impedances of at least two impedance transformers;

selectively switching a first switch between the first input and the chosen transformer;

selectively switching a second switch between an output and the chosen transformer; and receiving an output signal at the output, the output signal having substantially a same power as the input signal.

9. The method of matching impedances as set forth in claim 8, further including:

receiving second, third, and fourth signals at respective second, third, and fourth inputs, the input signal including the first, second, third, and fourth signals;

wherein the determining step includes:

determining the chosen transformer as a function of respective impedances of the four inputs.

10. The method of matching impedances as set forth in claim 9, wherein the determining step includes:

determining a number of the inputs connected to an electrical ground.

11. The method of matching impedances as set forth in claim 10, wherein the determining step includes:

determining the impedance transformer for transforming an impedance of the input signal to substantially match an impedance of the output.

12. The method of matching impedances as set forth in claim 10, further including:

selectively switching at least two grounding switches of the respective inputs between a signal source and the ground.

13. The method of matching impedances as set forth in claim 8, further including:

receiving a second signal at a second input, the input signal including the first and second signals;

determining a second chosen impedance transformer at least as a function of an impedance of the second input and respective impedances of at least two additional impedance transformers;

selectively switching a third switch between the second input and the second chosen transformer; and selectively switching a fourth switch between the second chosen transformer and the output.

14. An impedance transforming device, comprising:

a first port capable of receiving first signals;

a first switching device electrically connected to the first port;

at least two impedance transforming devices, the first switching device being electrically and dynamically connected to an input of one of the impedance transforming devices;

a second switching device electrically and dynamically connected to an output of the impedance transforming device; and a second port, electrically connected to the second switching device, capable of outputting second signals, the impedance transforming device being determined at least as a function of respective impedance transformations of the impedance transforming devices.

15. The impedance transforming device as set forth in claim 14, further including:

third, fourth, and fifth ports capable of receiving respective third, fourth, and fifth signals; and an electrical connection point electrically connected to the first, third, fourth, and fifth ports and to the first switching device.

16. The impedance transforming device as set forth in claim 14, further including:

a third port capable of receiving third signals;

a third switching device electrically connected to the third port;

at least two additional impedance matching devices, the third switching device being electrically and dynamically connected to one of the additional impedance transforming devices;

a fourth switching device electrically and dynamically connected to the additional impedance transforming device; and an electrical connector electrically connected to the second and fourth switching devices and the second port, the additional impedance transforming device being determined at least as a function of respective impedance transformations of the additional impedance transforming devices.

* * * * *